US011721290B2

United States Patent
Yu et al.

(10) Patent No.: US 11,721,290 B2
(45) Date of Patent: Aug. 8, 2023

(54) GATE DRIVING CIRCUIT AND DISPLAY DEVICE INCLUDING THE SAME

(71) Applicant: LG DISPLAY CO., LTD., Seoul (KR)

(72) Inventors: Jae Sung Yu, Paju-si (KR); Jae Hoon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/953,290

(22) Filed: Sep. 26, 2022

(65) Prior Publication Data

US 2023/0097004 A1 Mar. 30, 2023

(30) Foreign Application Priority Data

Sep. 30, 2021 (KR) .......................... 10-2021-0130008
Dec. 20, 2021 (KR) .......................... 10-2021-0182453

(51) Int. Cl.
  *G09G 3/3266* (2016.01)
  *G09G 3/3291* (2016.01)

(52) U.S. Cl.
  CPC ......... *G09G 3/3266* (2013.01); *G09G 3/3291* (2013.01); *G09G 2300/0426* (2013.01); *G09G 2300/0852* (2013.01); *G09G 2310/0291* (2013.01); *G09G 2330/021* (2013.01)

(58) Field of Classification Search
  None
  See application file for complete search history.

(56) References Cited

U.S. PATENT DOCUMENTS

| 10,068,530 | B2* | 9/2018 | Lee | .................. G11C 19/186 |
| 10,672,357 | B2* | 6/2020 | Lee | .................. G09G 3/3677 |
| 2014/0028659 | A1* | 1/2014 | Yamazaki | ............ G02F 1/1368 345/213 |
| 2014/0055436 | A1 | 2/2014 | Han et al. | |
| 2016/0042691 | A1 | 2/2016 | Na et al. | |
| 2016/0203786 | A1 | 7/2016 | Lim et al. | |
| 2017/0069283 | A1* | 3/2017 | You | .................. G09G 3/2022 |
| 2017/0186394 | A1* | 6/2017 | Park | .................. G09G 3/3696 |
| 2017/0193949 | A1* | 7/2017 | Kim | .................. G09G 3/3677 |

(Continued)

FOREIGN PATENT DOCUMENTS

KR  10-2014-0025794 A  3/2014
KR  10-2016-0017789 A  2/2016

(Continued)

*Primary Examiner* — Sepehr Azari
(74) *Attorney, Agent, or Firm* — Morgan, Lewis & Bockius LLP

(57) ABSTRACT

A gate driving circuit and a display device including the same are disclosed. The gate driving circuit includes signal transmitters receiving a start pulse, a shift clock, a charge/discharge clock, a back-bias clock, a high-potential driving voltage, and a low-potential reference voltage, and connected in a cascade structure. An Nth (N is a positive integer) signal transmitter of the signal transmitters includes a first control node; a second control node; a first controller controlling charging and discharging of the first control node by using at least one transistor to which the back-bias clock is inputted; a second controller controlling charging and discharging of the second control node; a first output buffer outputting a carry pulse in response to voltages of the first and second control nodes; and a second output buffer outputting a gate pulse.

18 Claims, 13 Drawing Sheets

(56) References Cited

U.S. PATENT DOCUMENTS

| | | | | |
|---|---|---|---|---|
| 2017/0193955 A1* | 7/2017 | Kim | ...................... | H01L 27/124 |
| 2017/0206826 A1* | 7/2017 | Kong | ...................... | G09G 3/20 |
| 2018/0130435 A1* | 5/2018 | Lee | ...................... | G09G 3/3677 |
| 2019/0304374 A1 | 10/2019 | Wang et al. | | |
| 2021/0020090 A1* | 1/2021 | Shang | ...................... | G09G 3/20 |

FOREIGN PATENT DOCUMENTS

| | | |
|---|---|---|
| KR | 10-2016-0087952 A | 7/2016 |
| KR | 10-2017-0030714 A | 3/2017 |
| KR | 10-2017-0077941 A | 7/2017 |
| KR | 10-2017-0081800 A | 7/2017 |
| KR | 10-2017-0081801 A | 7/2017 |
| KR | 10-2019-0115546 A | 10/2019 |

* cited by examiner

GATE DRIVING CIRCUIT AND DISPLAY DEVICE INCLUDING THE SAME

CROSS-REFERENCE TO RELATED APPLICATION

This application claims priority to and the benefit of Korean Patent Application No. 10-2021-0130008, filed on Sep. 30, 2021, and Korean Patent Application No. 10-2021-0182453, filed on Dec. 20, 2021, the disclosures of which are incorporated herein by reference in its entirety.

BACKGROUND

1. Technical Field

The present disclosure relates to a gate driving circuit and a display device including the same.

2. Discussion of the Related Art

Electroluminescence display devices may be divided into inorganic light-emitting display devices and organic light-emitting display devices according to a material of an emission layer. An active matrix organic light-emitting display device includes an organic light-emitting diode (OLED) that generates light by itself and has advantages in terms of a high response rate, high luminous efficiency, high brightness, and a large viewing angle. In an organic light-emitting display device, an OLED is formed at each pixel. The organic light-emitting display device has a high response rate, high luminous efficiency, high brightness, and a large viewing angle and is capable of expressing black gradation in perfect black, thereby achieving a high contrast ratio and a high color reproduction rate.

A pixel circuit of a field-emission display device includes a light-emitting element, a driving element for driving the light-emitting element, and one or more switch elements. The switch elements are turned on or off according to a gate voltage to connect or disconnect main nodes of the pixel circuit. The driving element and the switch elements may be embodied together as a transistor.

A gate driving circuit generates a gate pulse applied to gate electrodes of switch elements constituting a pixel circuit. Because the gate driving circuit is composed of many transistors and the size of the transistor is increased, the gate driving circuit disposed on a substrate of a display panel may cause a bezel area of the display panel to be increased. For example, when the Q node maintains a high voltage in the gate driving circuit, an on-state transistor having a large channel width may be applied so as to offset a leakage current of an off-state transistor connected to the Q node. For this reason, it is difficult to reduce the size of the bezel area occupied by the gate driving circuit in the display panel.

SUMMARY

Accordingly, embodiments of the present disclosure are directed to a gate driving circuit and a display device including the same that substantially obviates one or more of the problems due to limitations and disadvantages of the related art.

An aspect of the present disclosure is to provide a gate driving circuit capable of reducing a bezel area of a display panel and preventing a leakage current, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a gate driving circuit comprises signal transmitters receiving a start pulse, a shift clock, a charge/discharge clock, a back-bias clock, a high-potential driving voltage, and a low-potential reference voltage, and connected in a cascade structure. An Nth (N is a positive integer) signal transmitter of the signal transmitters includes a first control node; a second control node; a first controller controlling charging and discharging of the first control node by using at least one transistor to which the back-bias clock is inputted; a second controller controlling charging and discharging of the second control node; a first output buffer outputting a carry pulse in response to voltages of the first and second control nodes; and a second output buffer outputting a gate pulse.

In another aspect, a gate driving circuit comprises signal transmitters receiving a start pulse, a shift clock, a charge/discharge clock, a back-bias clock, a high-potential driving voltage, and a low-potential reference voltage, and connected in a cascade structure. An Nth (N is a positive integer) signal transmitter of the signal transmitters includes a first control node; a second control node; a first controller controlling charging and discharging of the first control node by using at least one 4-terminal transistor to which the back-bias clock is inputted; a second controller controlling charging and discharging of the second control node by using at least one 4-terminal transistor to which the back-bias clock is inputted; a first output buffer outputting a carry pulse in response to voltages of the first and second control nodes; and a second output buffer outputting a gate pulse.

The display device of the present disclosure includes the gate driving circuit.

In another aspect, a display device comprises a display panel including a plurality of data lines to which a data voltage is applied, a plurality of gate lines to which a gate pulse is applied, a plurality of clock lines, a plurality of power lines, a plurality of pixels, and a gate driving circuit generating the gate pulse, the gate driving circuit comprising: signal transmitters receiving a start pulse, a shift clock, a charge/discharge clock, a back-bias clock, a high-potential driving voltage, and a low-potential reference voltage, and connected in a cascade structure, an Nth (N is a positive integer) signal transmitter of the signal transmitters including: a first control node; a second control node; a first controller controlling charging and discharging of the first control node by using at least one transistor to which the back-bias clock is inputted; a second controller controlling charging and discharging of the second control node; a first output buffer outputting a carry pulse in response to voltages of the first and second control nodes; and a second output buffer outputting the gate pulse.

According to the present disclosure, using one or more 4-terminal transistors to which a back-bias clock is inputted can minimize a leakage current and increase an on-current when a high voltage is transmitted.

The gate driving circuit of the present disclosure can minimize the leakage current of the transistor and minimize the size of the transistors constituting the controller, thereby reducing the bezel area of the display panel and also reducing power consumption of the display device. As a result of the simulation, it was confirmed that the leakage current of the 4-terminal transistors constituting the gate driving circuit was suppressed to nano-ampere or less.

According to the present disclosure, because the size of the transistor of the gate driving circuit is reduced, the current of the clock wiring can be reduced, and because most of the current is used for charging and discharging of the control nodes, the reactive power can be reduced.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
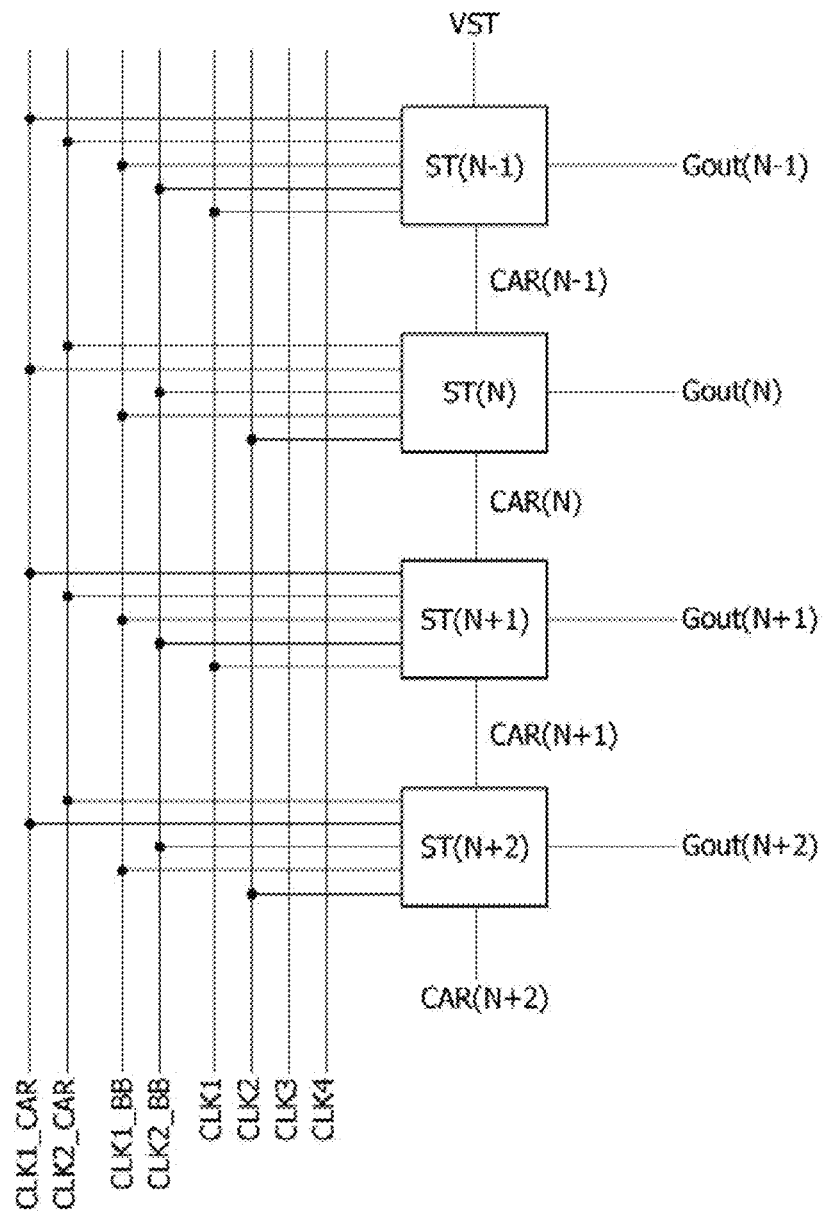
FIG. 1 is a diagram schematically illustrating a shift register of a gate driving circuit according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

In a display device of the present disclosure, the pixel circuit and the gate driving circuit may include a plurality of transistors. Transistors may be implemented as oxide thin film transistors (oxide TFTs) including an oxide semiconductor, low temperature polysilicon (LTPS) TFTs including low temperature polysilicon, or the like. In embodiments, descriptions will be given based on an example in which the transistors of the pixel circuit are implemented as the n-channel oxide TFTs.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

Hereinafter, various embodiments of the present disclosure will be described in detail with reference to the accompanying drawings. In the following embodiments, a display device will be described focusing on an organic light emitting display device, but the present disclosure is not limited thereto.

Figure 2:
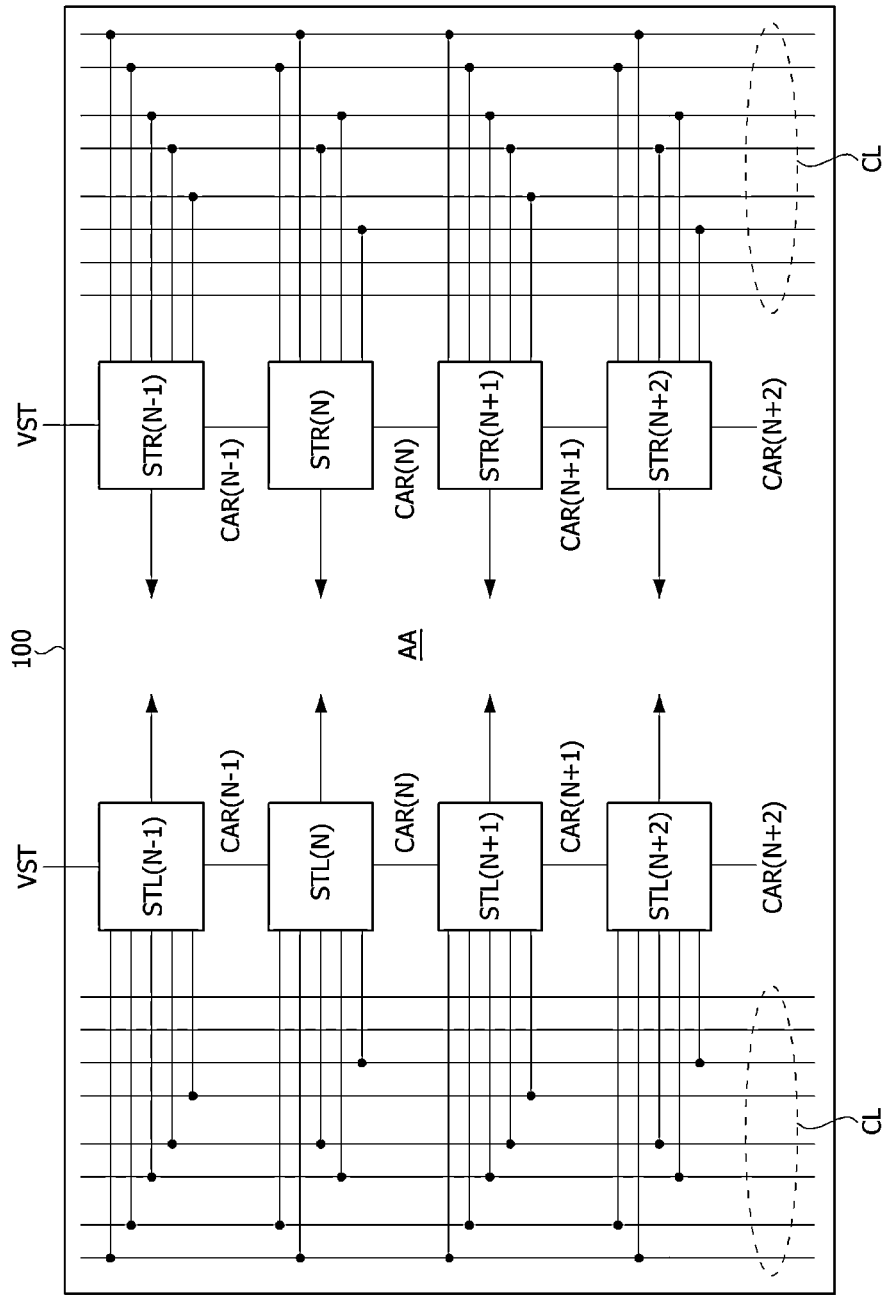
FIGS. 2 and 3 are diagrams illustrating a shift register disposed in a display panel.
Figure 3:
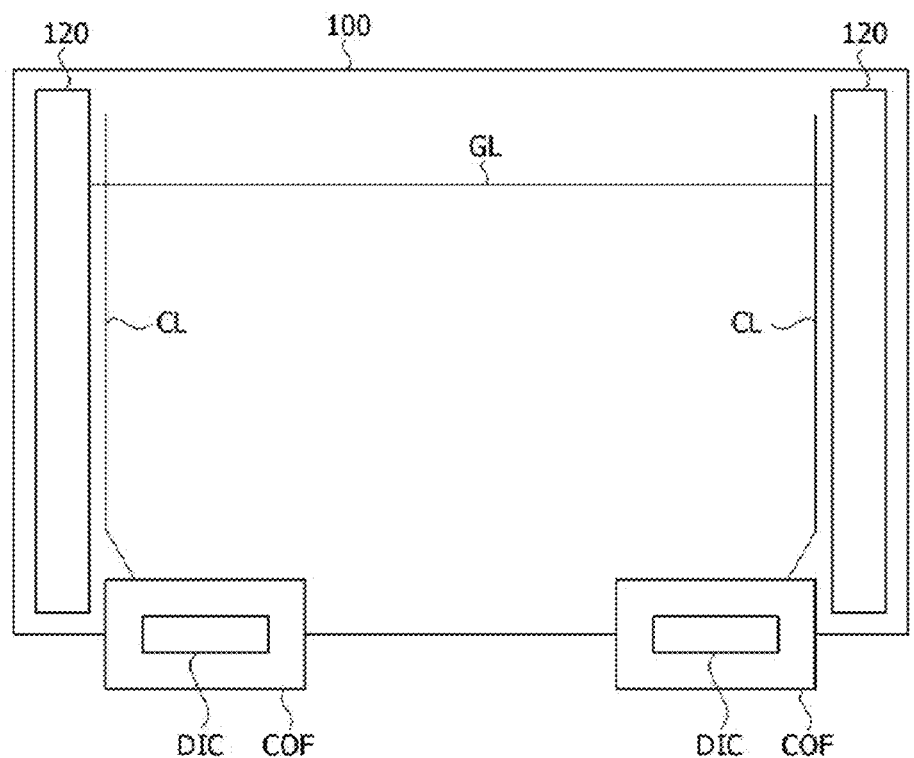

Referring to FIGS. 1 to 3, the gate driving circuit of the present disclosure includes a shift register that synchronizes with shift clocks CLK1 to CLK4 and sequentially outputs pulses of a gate signal (hereinafter referred to as "gate pulses") [Gout(N−1) to Gout(N+2]. Here, 'N' is a positive integer.

The shift register includes signal transmitters [[ST(N−1)] to ST(N+2)] connected in a cascade structure and thereby sequentially generates outputs, that is, gate pulses [Gout(N−1) to Gout(N+2]. Each of the signal transmitters [[ST(N−1)] to ST(N+2)] includes a VST node to which a start signal VST or a carry pulse [[CAR(N−1)] to CAR(N+2] from the preceding signal transmitter is inputted, CLK nodes to which clocks CLK1 to CLK4, CLK1_CAR, CLK2_CAR, CLK1_BB, and CLK2_BB are inputted, a VDD node to which a high-potential driving voltage VGH is applied, a VSS node to which a low-potential reference voltage VGL is applied, first and second control nodes Q and QB for driving buffer transistors, and the like.

The start signal VST is inputted to a first signal transmitter. In FIG. 1, the N−1th signal transmitter [ST(N−1)] may be the first signal transmitter. The shift clocks CLK1 to CLK4 are illustrated as a four-phase clock, but are not limited thereto. For example, the shift clocks CLK1 to CLK4 may be a two-phase clock, a four-phase clock, a six-phase clock, or an eight-phase clock.

Compensation clocks CLK1_CAR, CLK2_CAR, CLK1_BB, and CLK2_BB are further inputted to the shift register. The compensation clocks CLK1_CAR, CLK2_CAR, CLK1_BB, and CLK2_BB include charge/discharge clocks CLK1_CAR and CLK2_CAR for increasing the on-current Ion generated when the transistors charging/discharging the control nodes Q and QB are turned on, and back-bias clocks CLK1_BB and CLK2_BB for preventing the static leakage current Ioll generated in the off-state of the transistors.

A high voltage and a low voltage of the charge/discharge clocks CLK1_CAR and CLK2_CAR are set to voltage levels different from those of the back-bias clocks CLK1_BB and CLK2_BB. The first charge/discharge clock CLK1_CAR is generated as a pulse in phase with the first back-bias clock CLK1_BB. The second charge/discharge clock CLK2_CAR is generated as a pulse in phase with the second back-bias clock CLK2_BB. The charge/discharge clocks CLK1_CAR and CLK2_CAR and the back-bias clocks CLK1_BB and CLK2_BB are illustrated as two-phase clocks, but are not limited thereto.

The signal transmitters [ST(N)] to ST(N+2) dependently connected to the N−1th signal transmitter [ST(N−1)] receive a carry pulse CAR as a start signal from the preceding signal transmitter and starts to run. Each of the signal transmitters [[ST(N−1)] to ST(N+2)] outputs the carry pulse CAR through a first output node and simultaneously outputs the gate pulse [Gout(N−1) to Gout(N+2] through a second output node.

As shown in FIGS. 2 and 3, a gate driving circuit may be disposed in a display panel 100 on which an input image is reproduced. In FIGS. 2 and 3, the shift register of the gate driving circuit may include a first shift register (STL(N−1) to STL(N+2) disposed in a bezel area outside one side of a pixel array AA where the input image is reproduced, and a second shift register (STR(N−1) to STR(N+2) disposed in a bezel area outside the other side of the pixel array AA. In FIG. 3, a chip-on-film (COF) may be adhered to the display panel 100. A data driver or both the data driver and a touch sensor driver may be integrated in a drive IC DIC mounted on the COF. In FIG. 3, 'GL' denotes a gate line to which a gate pulse outputted from the signal transmitter is applied. 'CL' denotes a clock line to which the clocks CLK1 to CLK4, CLK1_CAR, CLK2_CAR, CLK1_BB, and CLK2_BB are inputted, and a power line to which constant voltages VGH and VGL are applied.

Figure 4:
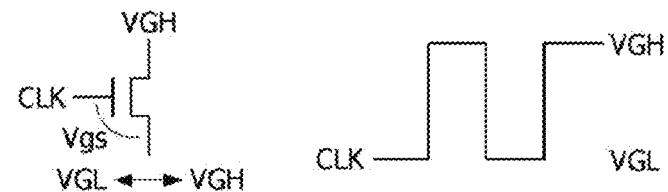
FIG. 4 is a diagram illustrating the transfer characteristic of a three-terminal transistor.
Figure 4:
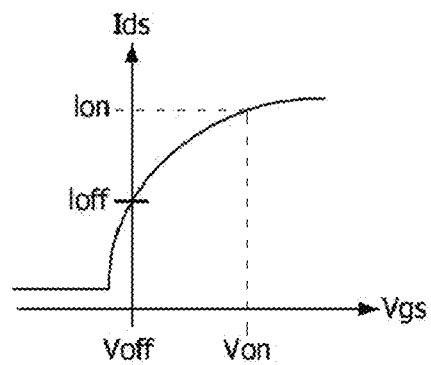
Figure 5:
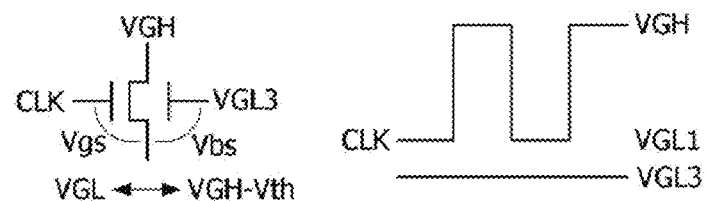
FIG. 5 is a diagram illustrating the transfer characteristic of a four-terminal transistor when a negative back-bias is applied to the transistor.
Figure 5:
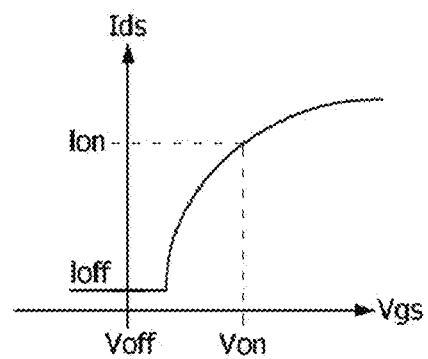
Figure 6:
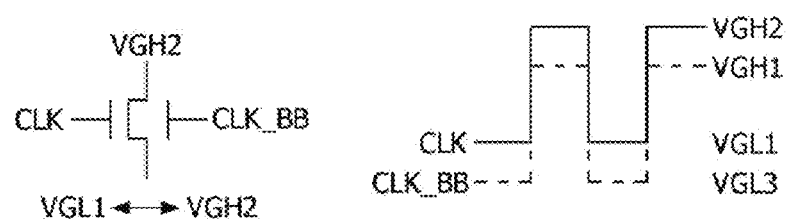
FIG. 6 is a diagram illustrating the transfer characteristic of a four-terminal transistor when a back-bias clock is applied to a second gate electrode of the transistor.
Figure 6:
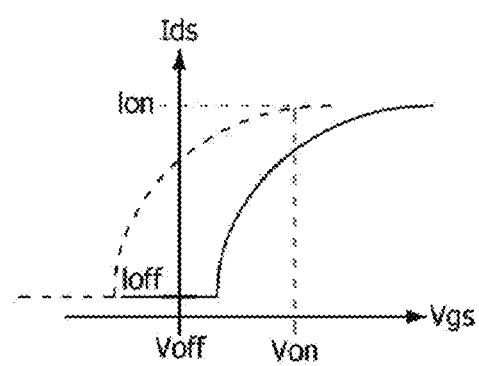

FIG. 4 is a diagram illustrating the transfer characteristic of a three-terminal transistor. FIG. 5 is a diagram illustrating the transfer characteristic of a four-terminal transistor when a negative back-bias is applied to the transistor. FIG. 6 is a diagram illustrating the transfer characteristic of a four-terminal transistor when a back-bias clock CLK_BB is applied to a second gate electrode (or a back gate electrode) of the transistor. In FIGS. 4 to 6, the horizontal axis is a gate-source voltage Vgs of the transistor, and the vertical axis is a drain-source current Ids of the transistor. 'Ioff' is a leakage current generated when the transistor is turned off, and 'Ion' is an on-current generated when the transistor is turned on.

Referring to FIG. 4, the 3-terminal transistor includes a gate electrode, a first electrode, and a second electrode. A shift clock CLK is applied to the gate electrode of the transistor, and a high-potential driving voltage VGH may be applied to the first electrode. In FIG. 4, the shift clock CLK swings between the high-potential driving voltage VGH and a low-potential reference voltage VGL. When the transistor is turned on/off, the voltage of the second electrode may vary between VGL and VGH. When the 3-terminal transistor is implemented as an n-channel oxide TFT, the threshold voltage Vth of the transistor may be near 0V. In this case, the leakage current Ioff may increase.

Referring to FIG. 5, the 4-terminal transistor includes a first gate electrode, a second gate electrode, a first electrode, and a second electrode. A gate-source voltage Vgs of the 4-terminal transistor is a voltage between the first gate electrode and the second electrode, and a back-bias voltage Vbs is a voltage between the second gate electrode and the second electrode. A shift clock CLK is applied to the first gate electrode of the transistor, and a low constant voltage, for example, a third low-potential reference voltage VGL3, may be applied to the second gate electrode. A high-potential driving voltage VGH may be applied to the first electrode. In FIG. 5, the shift clock CLK swings between the high-potential driving voltage VGH and a first low-potential reference voltage VGL1. When the transistor is turned on/off, the voltage of the second electrode may be changed between VGL and VGH-Vth. When the negative back-bias voltage Vbs is applied to the transistor, a threshold voltage Vth of the transistor may be shifted to a positive voltage greater than 0V. As a result, the leakage current Ioff is reduced to lower the power consumption.

Referring to FIG. 6, the shift clock CLK may be applied to the first gate electrode of the 4-terminal transistor, and a back-bias clock CLK_BB may be applied to the second gate electrode of the 4-terminal transistor. A high-potential driving voltage VGH2 may be applied to the first electrode. In FIG. 6, the shift clock CLK swings between a second high-potential driving voltage VGH2 and a first low-potential reference voltage VGL1. The back-bias clock CLK_BB may swing between the first high-potential driving voltage VGH1 and a third low-potential reference voltage VGL3. When the transistor is turned on/off, the voltage of the second electrode may vary between VGL1 and VGH2. When the back-bias clock CLK_BB is a third low-potential reference voltage VGL3, a negative back-bias voltage Vbs<0 is applied to the transistor, and thereby the leakage current Ioff is reduced. When the back-bias clock CLK_BB is the first high-potential driving voltage VGH1, a positive back-bias voltage Vbs>0 is applied to the transistor, and thereby the on-current Ion is increased. Therefore, the back-bias clock CLK_BB may simultaneously improve the on/off characteristics of the transistor. The high voltage of the back-bias clock CLK_BB may be appropriately set in consideration of the PBTS (positive bias temperature stress), and the low voltage may be appropriately set in consideration of the leakage current Ioff.

In FIG. 5, when a high voltage, that is, the high-potential driving voltage VGH, is applied to the first electrode, a negative back-bias is applied to the second gate electrode due to an increase in a source voltage Vs, and thus the transistor is turned off. In the 4-terminal transistor driving method as shown in FIG. 5, the high-potential driving voltage VGH is not transferred to the second electrode. In the 4-terminal transistor driving method as shown in FIG. 6, when the high-potential driving voltage VGH2 is applied to the first electrode, the high-potential driving voltage VGH2 may be transferred to the second electrode.

Figure 7:
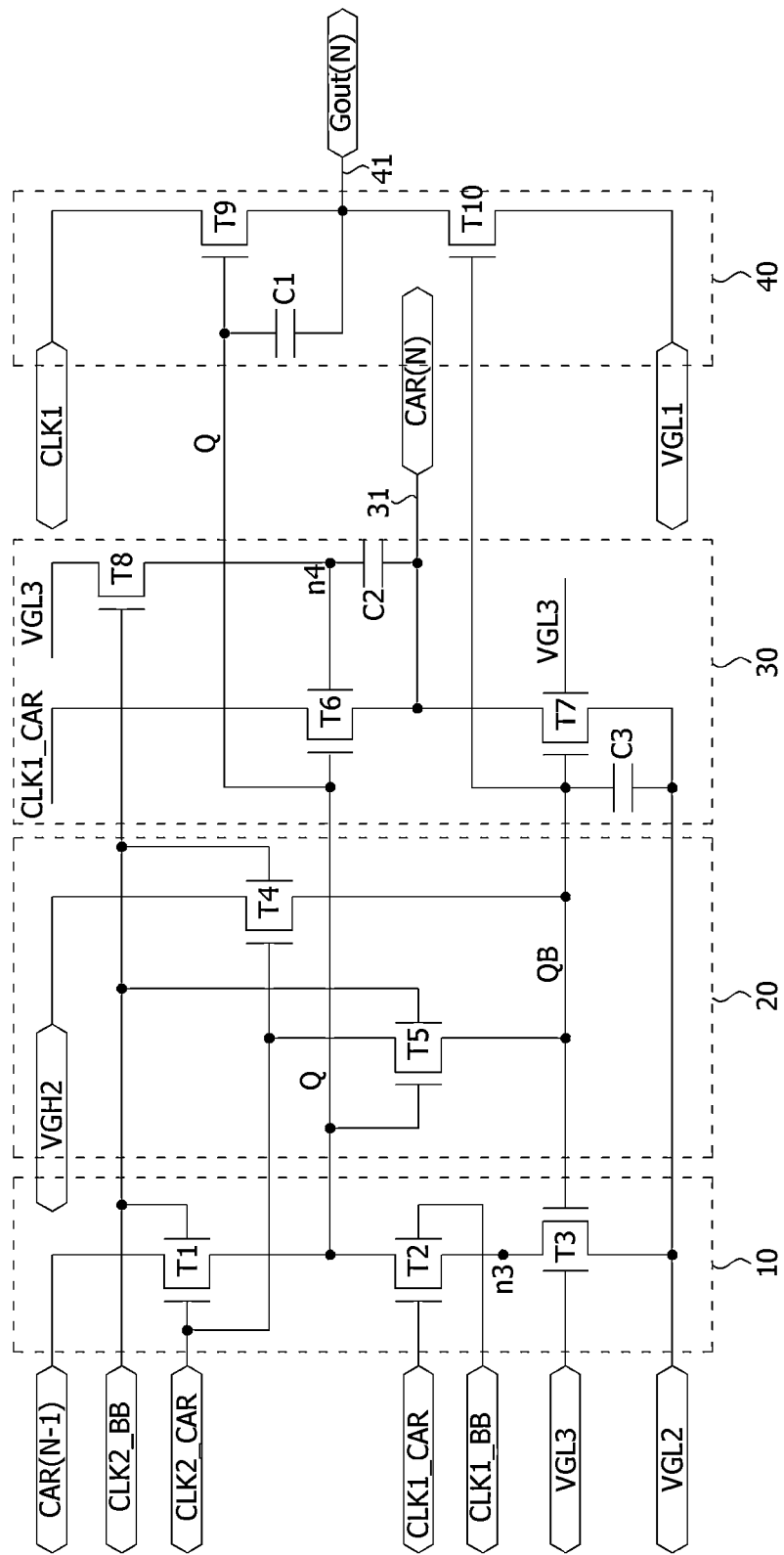
FIG. 7 is a circuit diagram illustrating a signal transmitter in detail.
Figure 8:
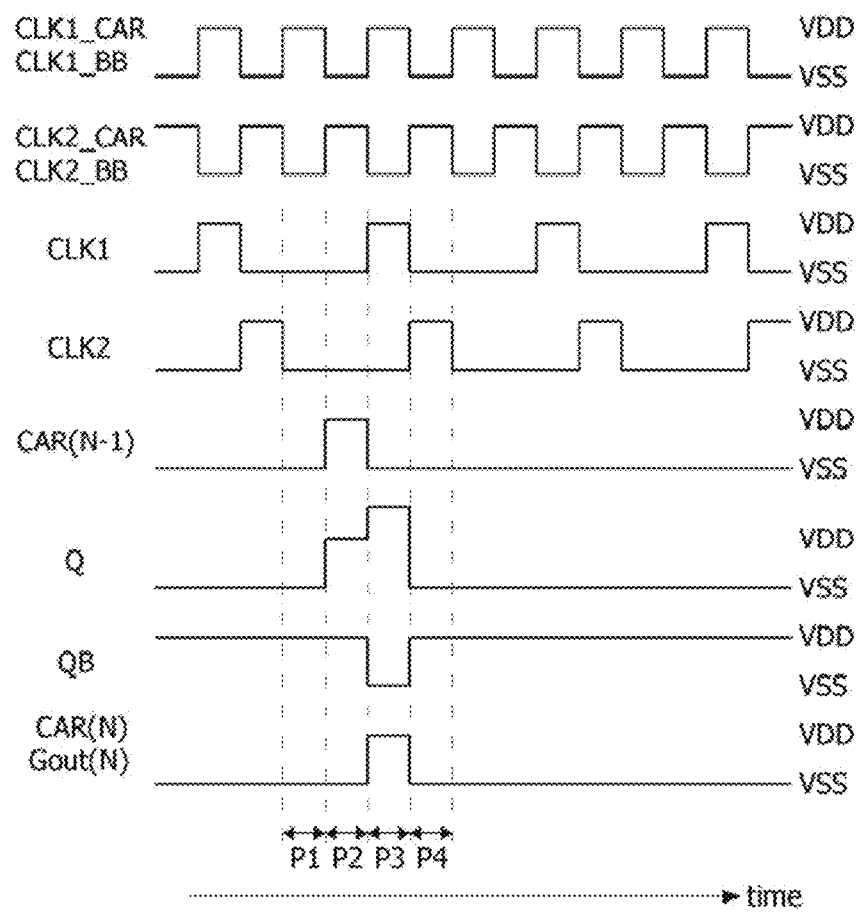
FIG. 8 is a waveform diagram illustrating clocks, control node voltages, and gate pulses.
Figure 9:
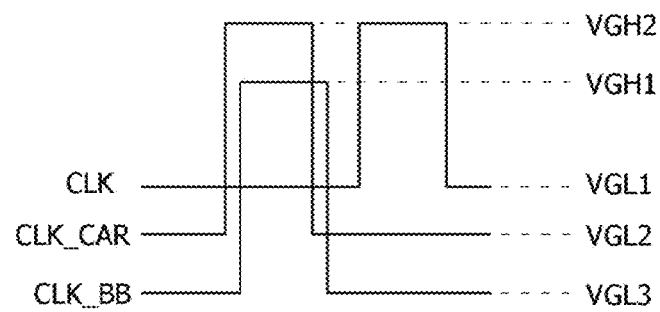
FIG. 9 is a waveform diagram illustrating voltages of clocks.

FIG. 7 is a circuit diagram illustrating in detail the Nth signal transmitter [ST(N)] according to an embodiment of the present disclosure. The signal transmitters other than the Nth signal transmitter [ST(N)] may be implemented with substantially the same circuit as the Nth signal transmitter [ST(N)]. FIG. 8 is a waveform diagram illustrating clocks inputted to a gate driving circuit, control node voltages, and gate pulses. FIG. 9 is a waveform diagram illustrating voltages of clocks.

Referring to FIGS. 7 to 9, the Nth signal transmitter [ST(N)] includes a first control node Q, a second control node QB, a first controller 10 for controlling the charging and discharging of the first control node Q by using at least one transistor to which a back-bias clock CLK1_BB or CLK2_BB is applied, a second controller 20 for controlling the charging and discharging of the second control node QB by using at least one transistor to which a back-bias clock CLK2_BB is applied, a first output buffer 30 for outputting a carry pulse [CAR(N)] in response to voltages of the first and second control nodes Q and QB, and a second output buffer 40 for outputting a gate pulse [Gout(N)] in response to voltages of the first and second control nodes Q and QB. All transistors T1 to T10 constituting the Nth signal transmitter [ST(N)] may be implemented as n-channel oxide TFTs.

Clocks such as a start pulse or carry pulse [CAR(N−1)], a shift clock CLK1, and compensation clocks CLK1_CAR, CLK1_BB, CLK2_CAR, and CLK2_BB are inputted to the Nth signal transmitter [ST(N)]. Constant voltages such as a high-potential driving voltage VGH2 and low-potential reference voltages VGL1, VGL2, and VGL3 are applied to the Nth signal transmitter [ST(N)].

As shown in FIGS. 8 and 9, a first compensation clock pair CLK1_CAR and CLK1_BB includes a first charge/discharge clock CLK1_CAR and a first back-bias clock CLK1_BB that are generated in phase. A high voltage and a low voltage of the first charge/discharge clock CLK1_CAR and the first back-bias clock CLK1_BB are different from each other.

A second compensation clock pair CLK2_CAR and CLK2_BB includes a second charge/discharge clock CLK2_CAR and a second back-bias clock CLK2_BB that are generated in phase. A high voltage and a low voltage of the second charge/discharge clock CLK2_CAR and the second back-bias clock CLK2_BB are different from each other. The first compensation clock pair CLK1_CAR and CLK1_BB and the second compensation clock pair CLK2_CAR and CLK2_BB are in antiphase. That is, the second compensation clock pair CLK2_CAR and CLK2_BB has a phase difference of 180 degrees with respect to the first compensation clock pair CLK1_CAR and CLK1_BB.

A high voltage VGH2 of the first and second charge/discharge clocks CLK1_CAR and CLK2_CAR is set to be higher than a high voltage VGH1 of the first and second back-bias clocks CLK1_BB and CLK2_BB. The high voltage VGH2 of the first and second charge/discharge clocks CLK1_CAR and CLK2_CAR may each be set to a voltage greater than or equal to a high voltage VGH2 of the shift clock CLK1. In FIG. 9, the high voltage VGH2 of the first and second charge/discharge clocks CLK1_CAR and CLK2_CAR is exemplarily shown as the same voltage as the high voltage VGH2 of the shift clock CLK1, but is not limited thereto.

A low voltage VGL2 of the first and second charge/discharge clocks CLK1_CAR and CLK2_CAR is set to be higher than a low voltage VGL3 of the first and second back-bias clocks CLK1_BB and CLK2_BB. The low voltage VGL2 of the first and second charge/discharge clocks CLK1_CAR and CLK2_CAR may be set to be lower than a low voltage VGL1 of the shift clock CLK1.

The Nth signal transmitter [ST(N)] includes a VST node to which a start pulse VST or a carry pulse [CAR(N−1)] from the preceding signal transmitter [SN(N−1)] is inputted, a VDD node to which a high-potential driving voltage VGH2 is applied, VSS nodes to which low-potential reference voltages VGL1, VGL2, and VGL3 are applied, and a CLK node to which a clock is inputted. The VST node and the CLK node are connected to clock lines in the display panel 100.

The Nth signal transmitter [ST(N)] outputs a carry pulse [CAR(N)] through a first output node 31, and outputs a gate pulse [Gout(N)] through a second output node 41.

The first controller 10 charges and discharges the first and second control nodes Q and QB by receiving the start pulse VST or the N−1th carry pulse [CAR(N−1)] of the preceding signal transmitter [ST(N−1)] and also receiving the first and second charge/discharge clocks CLK1_CAR and CLK2_CAR.

The first controller 10 may include at least one 4-terminal transistor to which the back-bias clock is inputted. For example, the first controller 10 includes at least first to third transistors T1, T2, and T3.

The first transistor T1 connects the VST node, to which the start pulse VST or the N−1th carry pulse [CAR(N−1)] is applied, to the first control node Q in response to the second charge/discharge clock CLK2_CAR. The first transistor T1 is implemented as a 4-terminal transistor. The first transistor T1 includes a first gate electrode connected to a second-first CLK node to which the second charge/discharge clock CLK2_CAR is inputted, a second gate electrode connected to a second-second CLK node to which the second back-bias clock CLK2_BB is inputted, a first electrode connected to the VST node to which the start pulse VST or the N−1th carry pulse [CAR(N−1)] is inputted, and a second electrode connected to the first control node Q.

The second transistor T2 connects the first control node Q to a third node n3 in response to the first charge/discharge clock CLK1_CAR. The second transistor T2 is implemented as a 4-terminal transistor. The second transistor T2 includes a first gate electrode connected to a first-first CLK node to which the first charge/discharge clock CLK1_CAR is inputted, a second gate electrode connected to a first-second CLK node to which the first back-bias clock CLK1_BB is inputted, a first electrode connected to the first control node Q, and a second electrode connected to the third node n3.

The third transistor T3 connects the third node n3 to a second VSS node to which the second low-potential reference voltage VGL2 is applied, in response to the high voltage of the second control node QB. The second low-potential reference voltage VGL2 is a constant voltage lower than the first low-potential reference voltage VGL1. The third transistor T3 is implemented as a 4-terminal transistor. The third transistor T3 includes a first gate electrode connected to the second control node QB, a second gate electrode connected to a third VSS node to which the third low-potential reference voltage VGL3 is applied, a first electrode connected to the third node n3, and a second electrode connected to the second VSS node. The third low-potential reference voltage VGL3 is a constant voltage lower than the second low-potential reference voltage VGL2.

The second controller 20 may include at least one 4-terminal transistor to which the back-bias clock is inputted. For example, the second controller 20 includes at least fourth and fifth transistors T4 and T5.

The fourth transistor T4 connects the VDD node, to which the second high-potential driving voltage VGH2 is applied, to the second control node QB in response to the second charge/discharge clock CLK2_CAR. The fourth transistor T4 is implemented as a 4-terminal transistor. The fourth transistor T4 includes a first gate electrode connected to the second-first CLK node to which the second charge/discharge clock CLK2_CAR is inputted, a second gate electrode connected to the second-second CLK node to which the second back-bias clock CLK2_BB is inputted, a first electrode connected to the VDD node to which the second high-potential driving voltage VGH2 is applied, and a second electrode connected to the second control node QB.

The fifth transistor T5 connects the second-first CLK node, to which the second charge/discharge clock CLK2_CAR is inputted, to the second control node QB in response to the high voltage of the first control node Q. The fifth transistor T5 is implemented as a 4-terminal transistor. The fifth transistor T5 includes a first gate electrode connected to the first control node Q, a second gate electrode connected to the second-second CLK node to which the second back-bias clock CLK2_BB is inputted, a first electrode connected to the second-first CLK node to which the second charge/discharge clock CLK2_CAR is inputted, and a second electrode connected to the second control node QB.

The first output buffer 30 may at least one 4-terminal transistor including a second gate electrode to which a constant voltage is applied. For example, the first output buffer 30 includes at least sixth to eighth transistors T6, T7, and T8.

The sixth transistor T6 is a pull-up transistor that charges the first output node 31 in response to a boosted voltage VGH2+α of the first control node Q. When the sixth transistor T6 is turned on, the voltage of the second gate electrode is boosted due to boot strapping through a second capacitor C2 to increase the on-current Ion, and when the sixth transistor T6 is turned off, a negative back-bias is applied to minimize a leakage current. When the sixth transistor T6 is turned on, the carry pulse [CAR(N)] rises to the high voltage VGH2 of the first charge/discharge clock CLK1_CAR. The sixth transistor T6 is implemented as a 4-terminal transistor having a boot strapped back-bias structure. The sixth transistor T6 includes a first gate electrode connected to the first control node Q, a second gate electrode connected to a fourth node n4, a first electrode connected to the first-first CLK node to which the first charge/discharge clock CLK1_CAR is inputted, and a second electrode connected to the first output node 31. The second capacitor C2 is connected between the fourth node n4 and the first output node 31.

The seventh transistor T7 is a pull-down transistor that discharges the first output node 31 in response to the high voltage VGH2 of the second control node QB. When the seventh transistor T7 is turned on, the carry pulse [[CAR (N)]] is discharged up to the second low-potential reference voltage VGL2. The seventh transistor T7 is implemented as a 4-terminal transistor. The seventh transistor T7 includes a first gate electrode connected to the second control node QB, a second gate electrode connected to the third VSS node to which the third low-potential reference voltage VGL3 is applied, a first electrode connected to the first output node 31, and a second electrode connected to the second VSS node to which the second low-potential reference voltage VGL2 is applied. A third capacitor C3 is formed between the second control node QB and the second VSS node to suppress ripple of the second control node QB.

The eighth transistor T8 connects the third VSS node, to which the third low-potential reference voltage VGL3 is applied, to a fourth node n4 in response to the high voltage of the second back-bias clock CLK2_BB. The eighth transistor T8 is implemented as a 3-terminal transistor. The eighth transistor T8 includes a gate electrode connected to the second-second CLK node to which the second back-bias clock CLK2_BB is inputted, a first electrode connected to the third VSS node, and a second electrode connected to the fourth node n4.

The second output buffer 40 includes at least ninth and tenth transistors T9 and T10. The ninth and tenth transistors T9 and T10 may be implemented as large-capacity 3-terminal transistors having a higher channel ratio than the other transistors T1 to T8. The gate voltages of the ninth and tenth transistors T9 and T10, that is, the low voltages of the control nodes Q and QB, are always lower than when the source voltages of the transistors T9 and T10 are low voltages. Therefore, because the gate-source voltage Vgs of the ninth and tenth transistors T9 and T10 is always Vgs<0 in the off-state, even if the threshold voltage Vth of the transistors T9 and T10 is near 0, there is no leakage current Ioff, which is generated when the gate-source voltage Vgs is zero or close to zero. Thus, a leakage current does not occur in the ninth and tenth transistors T9 and T10 even though they are implemented as 3-terminal transistors.

The ninth transistor T9 is a pull-up transistor that charges the second output node 41 in response to the boosted voltage VGH2+α of the first control node Q. When the ninth transistor T9 is turned on, the voltage of the first control node Q is boosted due to boot strapping through a first capacitor C1, and the gate pulse [Gout(N)] rises up to the high voltage VGH2 of the first shift clock CLK1. The ninth transistor T9 is implemented as a 3-terminal transistor. The ninth transistor T9 includes a gate electrode connected to the first control node Q, a first electrode connected to the third CLK node to which the shift clock CLK1 is inputted, and a second electrode connected to the second output node 41. The first capacitor C1 is connected between the first control node Q and the second output node 41.

The tenth transistor T10 is a pull-down transistor that discharges the second output node 41 in response to the high voltage VGH2 of the second control node QB. When the tenth transistor T10 is turned on, the gate pulse [[Gout(N)]] is discharged up to the first low-potential reference voltage VGL1. The tenth transistor T10 is implemented as a 3-terminal transistor. The tenth transistor T10 includes a gate electrode connected to the second control node QB, a first electrode connected to the second output node 41, and a second electrode connected to the first VSS node to which the first low-potential reference voltage VGL1 is applied.

Referring to FIG. 9, the shift clock CLK swings between the second high-potential driving voltage VGH2 and the first low-potential reference voltage VGL1.

The charge/discharge clock CLK_CAR swings between the second high-potential driving voltage VGH2 and the second low-potential reference voltage VGL2 to increase the on-current of the transistor. The second low-potential reference voltage VGL2 is set to be lower than the first low-potential reference voltage VGL1.

The low voltage of the back-bias clock CLK_BB is set to be lower in order to apply a negative back-bias to the transistor, and the high voltage thereof is set to be lower in order to reduce positive bias temperature stress (PBTS). The back-bias clock CLK_BB may swing between the first high-potential driving voltage VGH1 and the third low-potential reference voltage VGL3. The first high-potential driving voltage VGH1 is set to be lower than the second high-potential driving voltage VGH2. The third low-potential reference voltage VGL3 is set to be lower than the second low-potential reference voltage VGL2.

Voltages of the clocks CLK, CLK_CAR, and CLK_BB may be set to, for example, VGH2=18V, VGH1=8V, VGL1=−6V, VGL2=−10V, and VGL3=−13V. In this case, a swing width of the charge/discharge clock CLK_CAR is greater than those of the shift clock CLK and the back-bias clock CLK_BB. The swing width of the shift clock CLK is greater than that of the back-bias clock CLK_BB. It should be noted that the voltages of the clocks CLK, CLK_CAR, and CLK_BB are not limited to the above example.

The driving period of the Nth signal transmitter [ST(N)] may include a first period P1, a second period P2, a third period P3, and a fourth period P4. Hereinafter, the operation per period of the Nth signal transmitter [ST(N)] will be described with reference to FIGS. 10 to 13.

Figure 10:
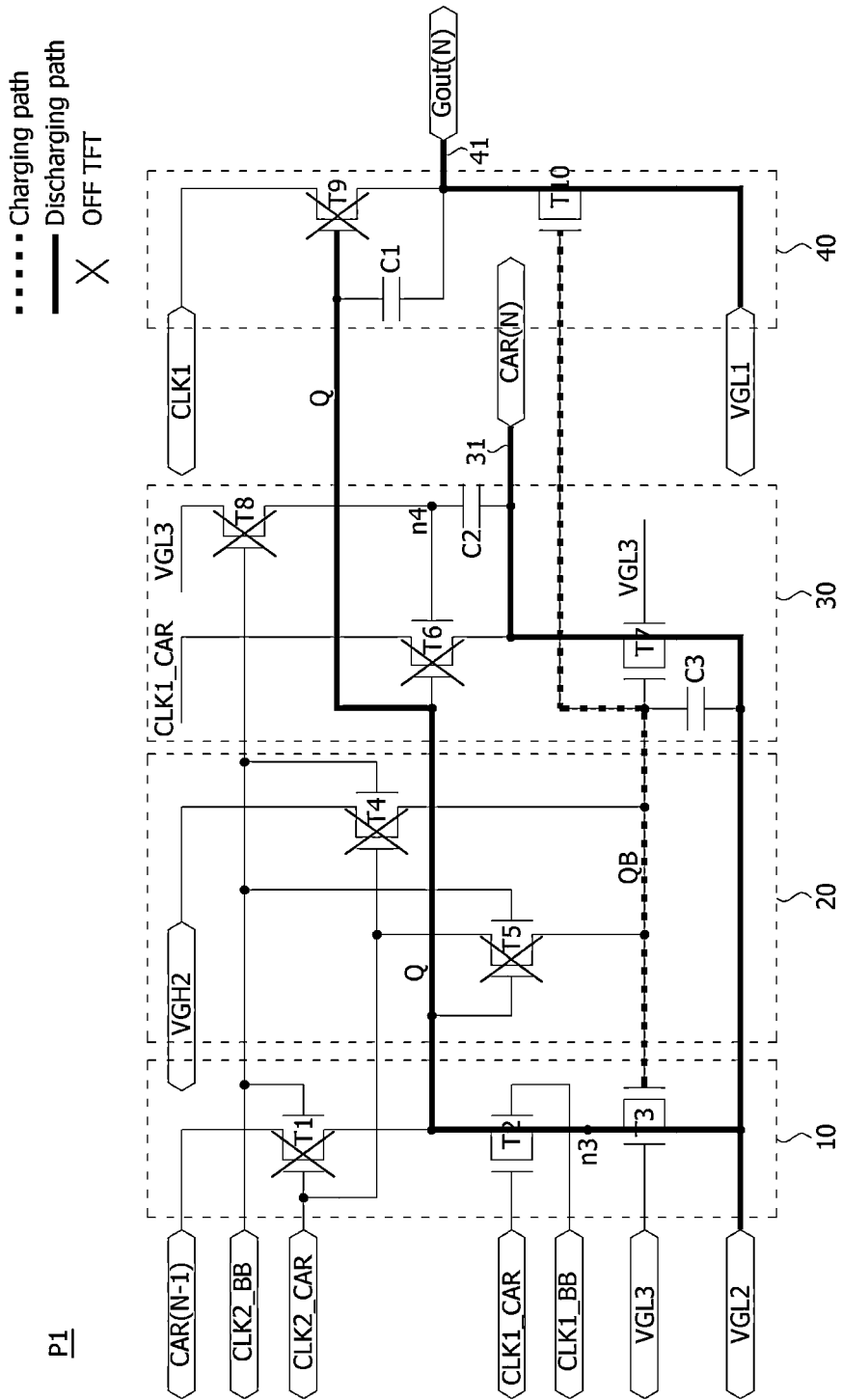
FIG. 10 is a circuit diagram illustrating an operation of a gate driving circuit in the first period shown in FIG. 8.

Referring to FIG. 10, during the first period P1, the second transistor T2 is turned on according to the high voltage VGH2 of the first charge/discharge clock CLK1_CAR, and the third, seventh, and tenth transistors T3, T7, and T10 are turned on according to the high voltage VGH2 of the second control node QB. During the first period P1, the second charge/discharge clock CLK2_CAR and the second back-bias clock CLK2_BB are low voltages VGL2 and VGL3, respectively, and the voltage of the first control node Q is the low voltage VGL2. As a result, the first, fourth, fifth, sixth, eighth, and ninth transistors T1, T4, T5, T6, T8, and T9 are turned off in the first period P1. Because a negative back-bias voltage Vbs<0 is applied to the 4-terminal transistors T1, T4, T5, and T6 in the off-state, the off-current Ioll is minimized at Vgs=0.

During the first period P1, the on-current Ion increases because the positive back-bias voltage Vbs>0 is applied to the 4-terminal transistors T2, T3, and T7 in the on-state. During the first period P1, the first and second output nodes 31 and 41 are discharged to the first and second VSS nodes through the pull-down transistors T7 and T10. During the first period P1, the voltages of the first and second output nodes 31 and 41 are low voltages VGL1 and VGL2, respectively.

Figure 11:
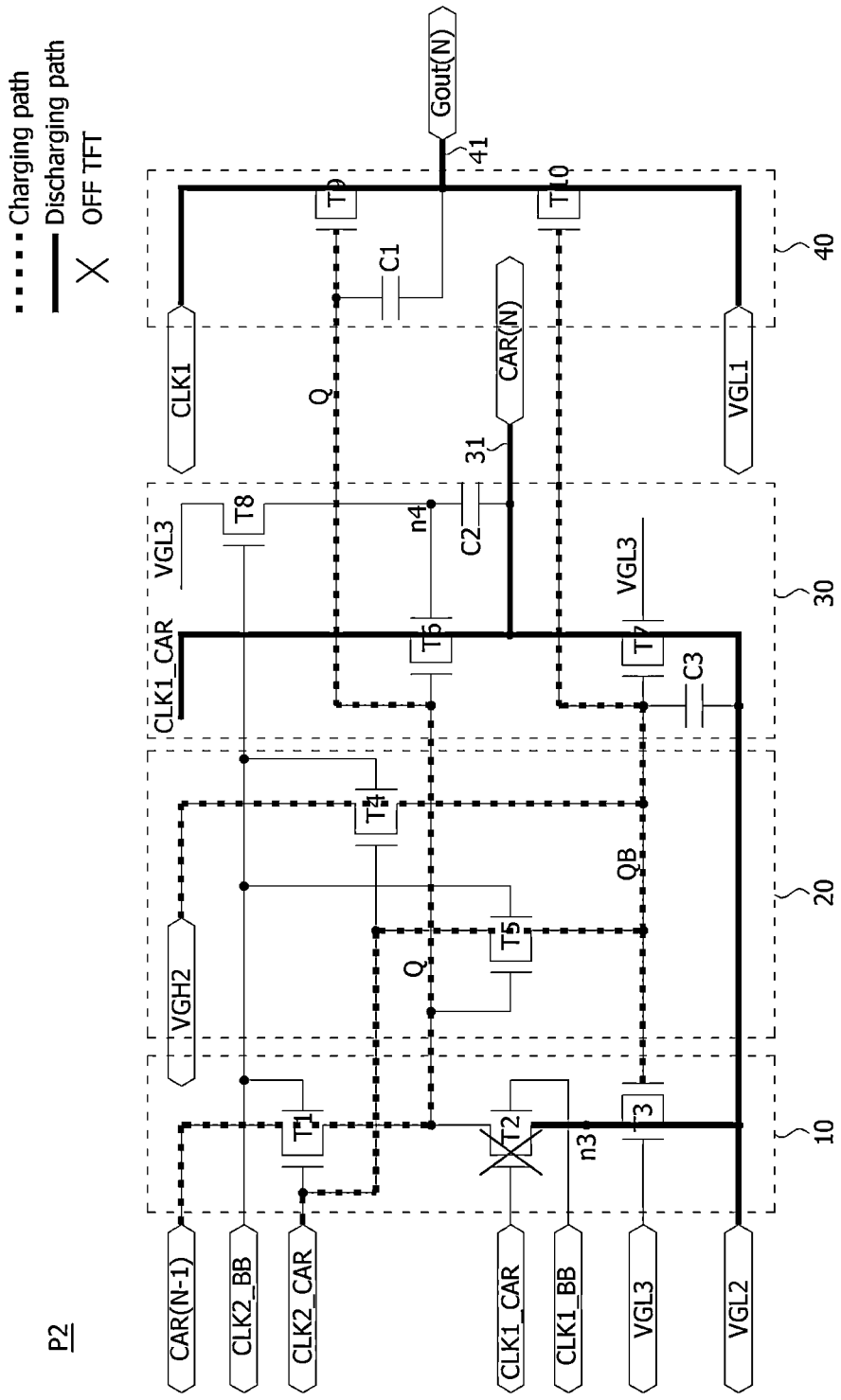
FIG. 11 is a circuit diagram illustrating an operation of a gate driving circuit in the second period shown in FIG. 8.

Referring to FIG. 11, in the second period P2, the carry pulse [CAR(N−1)] is outputted from the preceding stage [ST(N−1)], and the second charge/discharge clock CLK2_CAR and the second back-bias clock CLK2_BB are inverted to the high voltages VGH1 and VGH2. During the second period P2, the first and fourth transistors T1 and T4 are turned on according to the high voltage VGH2 of the second charge/discharge clock CLK2_CAR. At this time, the first control node Q is charged with the high voltage VGH2, and the second control node QB maintains the high voltage VGH2. The first charge/discharge clock CLK1_CAR and the first back-bias clock CLK1_BB are inverted to the low voltages VGL2 and VGL3 during the second period P2. As a result, the transistors T1, T3 to T10 except for the second transistor T2 are turned on during the second period P2.

During the second period P2, a negative back-bias voltage Vbs<0 is applied to the 4-terminal transistor T2 in the off-state, so that the off-current Ioff is minimized at Vgs=0. Because the positive back-bias voltage Vbs>0 is applied to the 4-terminal transistors T1, T3 to T7 in the on-state, the on-current Ion increases. During the second period P2, the first and second output nodes 31 and 41 are discharged to the first and second VSS nodes through the pull-down transistors T7 and T10. Therefore, the voltages of the first and second output nodes 31 and 41 maintain the low voltages VGL1 and VGL2 during the second period P2.

Figure 12:
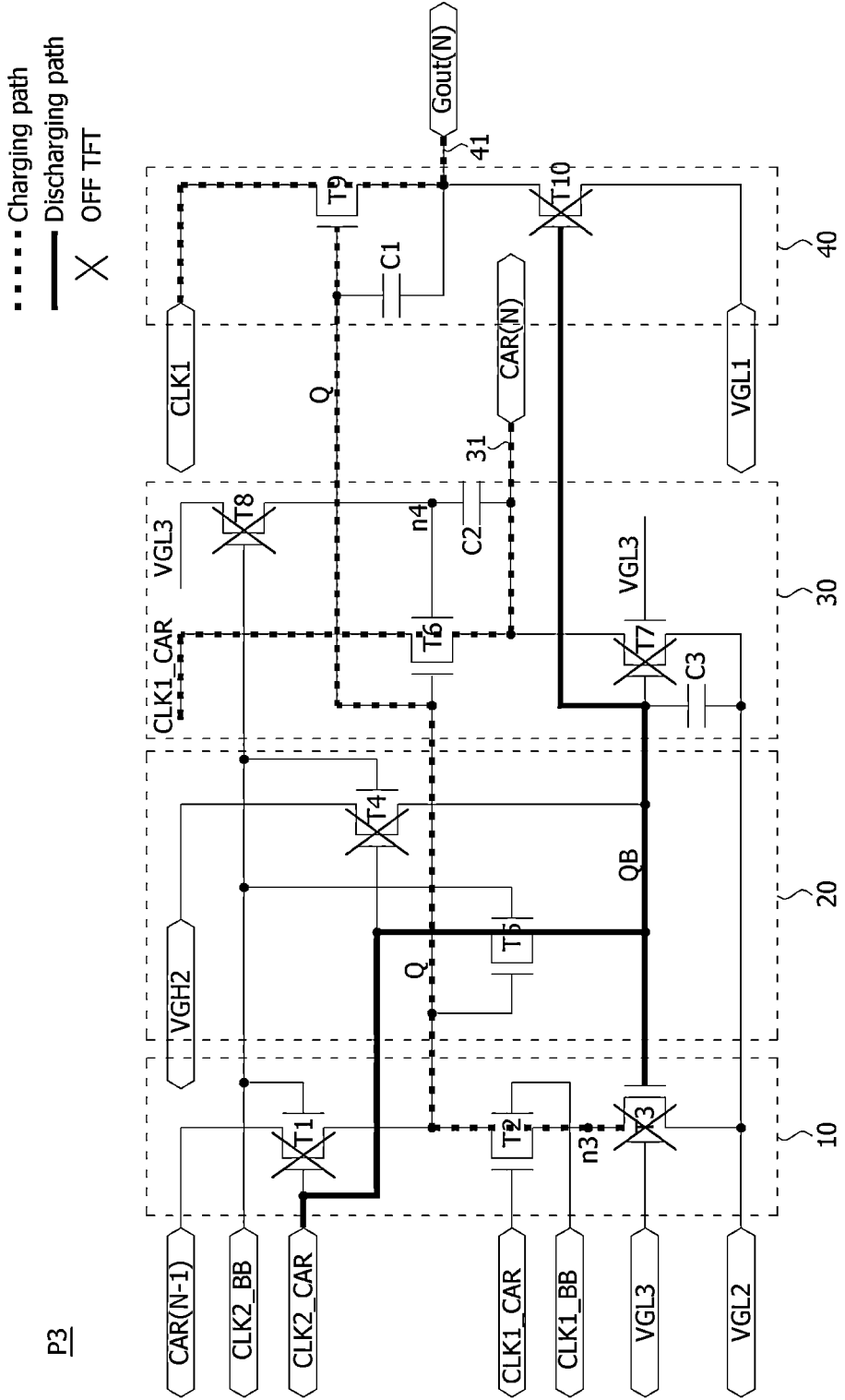
FIG. 12 is a circuit diagram illustrating an operation of a gate driving circuit in the third period shown in FIG. 8.

Referring to FIG. 12, in the third period P3, the first charge/discharge clock CLK1_CAR and the first back-bias clock CLK1_BB are inverted to the high voltages VGH1 and VGH2, and the second charge/discharge clock CLK2_CAR and the second back-bias clock CLK2_BB are inverted to the low voltages VGL2 and VGL3. At the same time, the shift clock CLK1 is generated with the high voltage VGH2.

When the high voltage VGH2 of the shift clock CLK1 is inputted to the first electrode of the tenth transistor T10, bootstrapping occurs through the first capacitor C1, and thereby the voltage of the first control node Q further rises to the boosted voltage VGH2+α in the third period P3. The second control node QB is discharged through the second-first CLK node, and its voltage is lowered to the low voltage VGL2. Therefore, during the third period P3, the second, fifth, sixth, and ninth transistors T2, T5, T6, and T9 are turned on, whereas the other transistors T1, T3, T4, T7, T8, and T10 are turned off.

During the third period P3, the negative back-bias voltage Vbs<0 is applied to the 4-terminal transistors T1, T3, T4, and T7 in the off-state, so that the off-current Ioff is minimized at Vgs=0. Because the positive back-bias voltage Vbs>0 is applied to the 4-terminal transistors T2, T5, and T6 in the on-state, the on-current Ion increases. During the third period P3, the first and second output nodes 31 and 41 are charged with a voltage supplied through the pull-up transistors T6 and T9. Therefore, in the third period P3, the gate pulse [Gout(N)] is generated with the high voltage VGH2, and also the carry pulse [CAR(N)] is generated with the high voltage VGH2. The gate pulse [Gout(N)] is applied to the gate line GL of the display panel 100. The carry pulse [CAR(N)] is applied to the VST node of the next signal transmitter ST(N+1).

Figure 13:
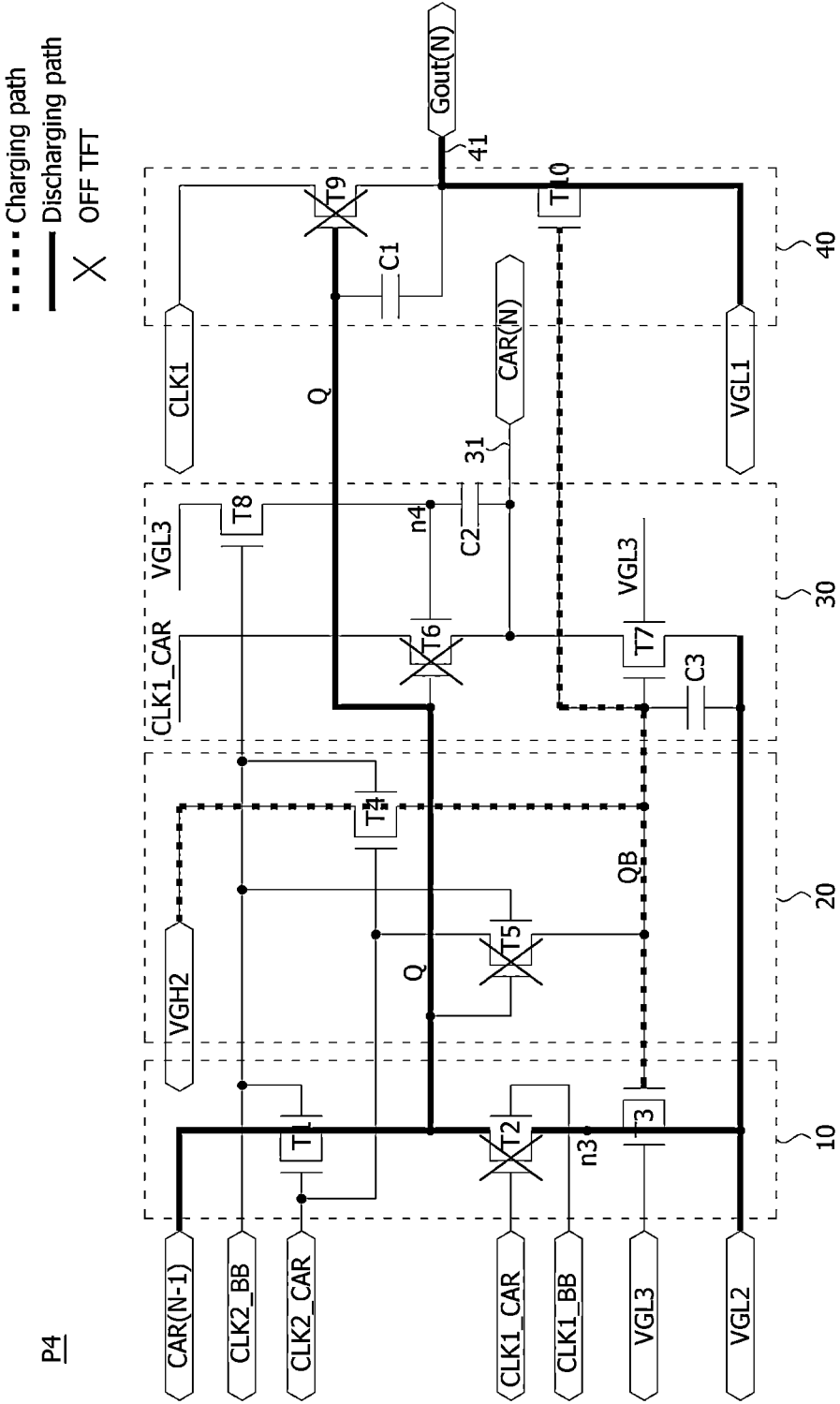
FIG. 13 is a circuit diagram illustrating an operation of a gate driving circuit in the fourth period shown in FIG. 8.

Referring to FIG. 13, in the fourth period P4, the second charge/discharge clock CLK2_CAR and the second back-bias clock CLK2_BB are inverted to the high voltages VGH1 and VGH2, and the first charge/discharge clock CLK1_CAR and the first back-bias clock CLK1_BB are inverted to the low voltages VGL2 and VGL3. At the same time, the shift clock CLK1 is inverted to the low voltage VGL1. Therefore, during the fourth period P4, the first, third, fourth, seventh, eighth, and tenth transistors T1, T3, T4, T7, T8, and T10 are turned on, whereas the other transistors T2, T5, T6, and T9 are turned off. Thus, during the fourth period P4, the first control node Q is discharged by the VST node through the first transistor T1, and its voltage is lowered to the low voltage VGL2. At this time, the second control node QB is charged with the high-potential driving voltage VGH2 applied through the fourth transistor T4, so that its voltage is increased to the high voltage VGH2 and the third, seventh, and tenth transistors T3, T7, and T10 are turned on.

During the fourth period P4, the negative back-bias voltage Vbs<0 is applied to the 4-terminal transistors T2, T5, and T6 in the off-state, so that the off-current Ioff is minimized at Vgs=0. Because the positive back-bias voltage Vbs>0 is applied to the 4-terminal transistors T1, T3, and T4 in the on-state, the on-current Ion increases. During the fourth period P4, the first and second output nodes 31 and 41 are discharged by the VSS nodes through the pull-down transistors T7 and T10, so that their voltages are lowered to the low voltages VGL1 and VGL2. Therefore, in the fourth period P4, the gate pulse [Gout(N)] is inverted to the low voltage VGL1, and also the carry pulse [CAR(N)] is inverted to the low voltage VGL2.

A constant voltage DC is applied to the second gate electrodes of the third and seventh transistors T3 and T7. This DC back-bias may be applied to the transistors T3 and T7 in which a condition that the gate voltage Vg is equal to or greater than the source voltage Vs (Vg≥Vs) is satisfied. The gate voltage Vg is a voltage applied to the first gate electrodes of the transistors T3 and T7. The source voltage Vs is a voltage applied to the second electrodes of the transistors T3 and T7. The back gate voltage Vb applied to the second gate electrode of the transistors T3 and T7 is set to be lower than the source voltage Vs so that the threshold voltage Vth of the transistors T3 and T7 can positively shift to a voltage higher than zero.

The back-bias clocks CLK1_BB and CLK2_BB are applied to the second gate electrodes of the first, second, fourth, and fifth transistors T1, T2, T4, and T5. These clock back-bias may be applied to the transistors T1, T2, T4, and T5 in which the source voltage Vs is not fixed and transmits a low voltage or a high voltage depending on conditions. When the transistors T1, T2, T4, and T5 are turned on, the back gate voltage Vb is set under the condition of Vg>Vb>Vs. Therefore, the transistors T1, T2, T4, and T5 are turned on by positive gate voltages Vg and Vb, and the on-current Ion increases.

When the transistors T1, T2, T4, and T5 are turned off, Vb<Vs. At this time, because the negative back-bias (Vbs<0) is applied to the transistors T1, T2, T4, and T5, the threshold voltage Vth of the transistors T1, T2, T4, and T5 positively shifts (Vth>0), and the leakage current Ioff can be minimized.

The bootstrap back-bias may be applied to an element, that is, the sixth transistor T6, in which the source voltage Vs is not fixed and transmits a low voltage or a high voltage depending on conditions. If the back gate voltage Vb is fixed when the sixth transistor T6 transfers the high voltage to the first output node, an excessive negative back-bias (Vbs<<0) is applied when the source voltage Vs rises. In this case, the threshold voltage Vth of the sixth transistor T6 may excessively positively shift (Vth>>0), so that the high voltage transfer rate may be reduced. Therefore, in the bootstrap structure, it is preferable that the back gate voltage Vb also rises through the capacitor C2 when the source voltage Vs of the sixth transistor T6 rises.

Figure 14:
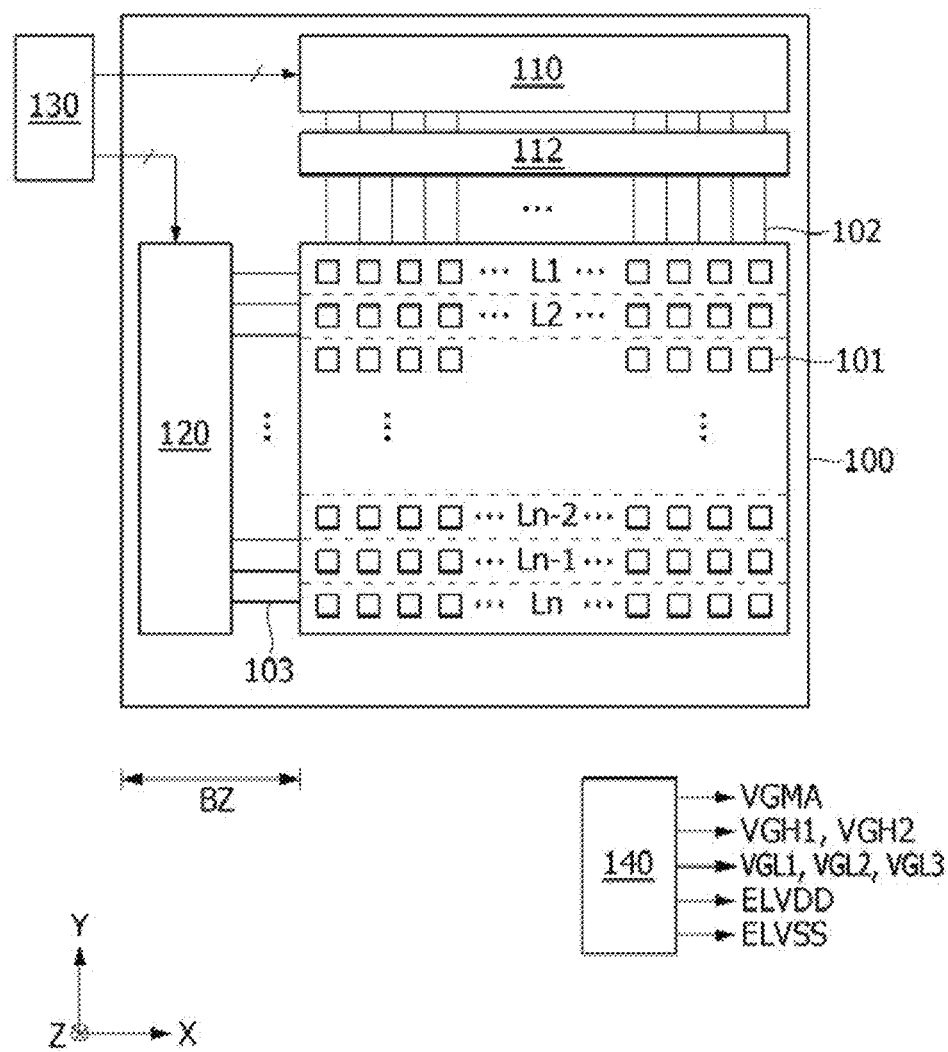
FIG. 14 is a block diagram illustrating a display device according to an embodiment of the present disclosure.
Figure 15:
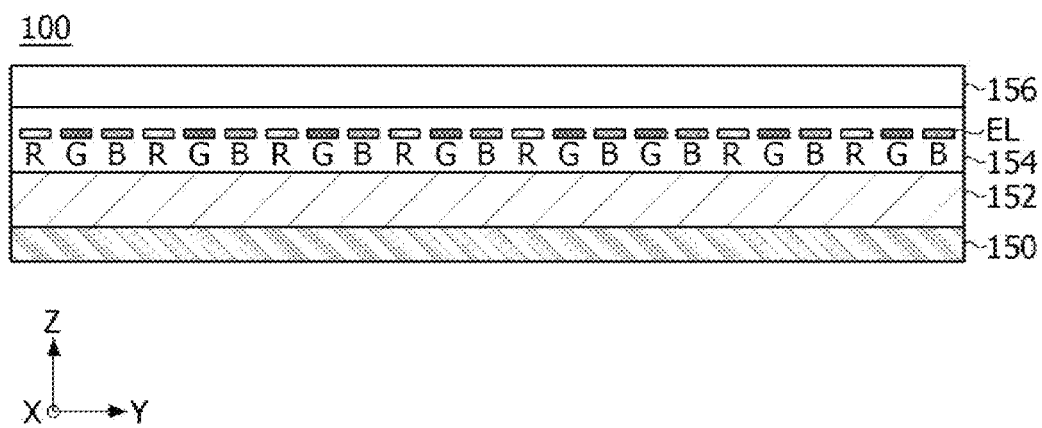
FIG. 15 is a cross-sectional view illustrating a cross-sectional structure of the display panel shown in FIG. 14.

FIG. 14 is a block diagram illustrating a display device according to an embodiment of the present disclosure. FIG. 15 is a cross-sectional view illustrating a cross-sectional structure of the display panel shown in FIG. 14.

Referring to FIGS. 14 and 15, the display device according to an embodiment of the present disclosure includes a display panel 100, a display panel driver for writing pixel data to pixels of the display panel 100, and a power supply 140 for generating power necessary for driving the pixels and the display panel driver.

The display panel 100 may be a panel having a rectangular structure with a length in the X-axis direction, a width in the Y-axis direction, and a thickness in the Z-axis direction. The display panel 100 includes a pixel array that displays an input image on a screen. The pixel array includes a plurality of data lines 102, a plurality of gate lines 103 intersected with the data lines 102, and pixels arranged in a matrix form. The display panel 100 may further include power lines commonly connected to the pixels. The power lines supply a constant voltage necessary for driving the pixels 101 to the pixels 101. For example, the display panel 100 includes power lines and clock lines connected to the pixels and the gate driving circuit 120.

As shown in FIG. 15, the cross-sectional structure of the display panel 100 may include a circuit layer 152, a light emitting element layer 154, and an encapsulation layer 156 stacked on a substrate 150.

The circuit layer 152 may include a thin-film transistor (TFT) array including a pixel circuit connected to wirings such as a data line, a gate line, a power line, and the like, a de-multiplexer array 112, and a gate driving circuit 120. The wirings and circuit elements in the circuit layer 152 may include a plurality of insulating layers, two or more metal layers separated with the insulating layer therebetween, and an active layer including a semiconductor material. All transistors formed in the circuit layer 152 may be implemented as n-channel oxide TFTs having a coplanar structure.

The circuit elements formed in the circuit layer 152 may include 4-terminal transistors. A first gate electrode (or top gate electrode) and a second gate electrode (or bottom gate electrode) of the 4-terminal transistor overlap with each other with a semiconductor active pattern interposed therebetween. A first insulating layer is disposed between the second gate electrode and the semiconductor active pattern, and a second insulating layer is disposed between the semiconductor active pattern and the first gate electrode.

The light-emitting element layer 154 may include a light-emitting element EL driven by the pixel circuit. The light-emitting elements EL may include a red (R) light-emitting element, a green (G) light-emitting element, and a blue (B) light-emitting element. In another embodiment, the light-emitting element layer 14 may include a white light-emitting element and a color filter. The light-emitting elements EL in the light-emitting element layer 154 may be covered by a multi-passivation layer including an organic film and an inorganic film.

The light-emitting element EL may be implemented as an OLED. The OLED includes an organic compound layer formed between an anode electrode and a cathode electrode. The organic compound layer may include, but is not limited to, a hole injection layer (HIL), a hole transport layer (HTL), an emission layer (EML), an electron transport layer (ETL), and an electron injection layer (EIL). When a voltage is applied to the anode and cathode electrodes of the OLED, the holes that have passed through the hole transport layer HTL and the electrons that have passed through the electron transport layer ETL are moved to the emission layer EML, and excitons are formed. In this case, visible light is emitted from the emission layer (EML). The OLED used as the light-emitting element EL may be of a tandem structure in which a plurality of light-emitting layers are stacked. An OLED having the tandem structure can improve the luminance and lifespan of pixels.

The encapsulation layer 156 covers the light-emitting element layer 154 to seal the circuit layer 152 and the light-emitting element layer 154. The encapsulation layer 156 may be a multi-insulating film structure in which an organic film and an inorganic film are alternately stacked. The inorganic film blocks infiltration of moisture or oxygen. The organic film planarizes a surface of the inorganic film. When the organic film and the inorganic film are stacked in multiple layers, a moving path of moisture or oxygen is longer than that of a single layer and thus the infiltration of moisture and oxygen that may influence the light-emitting element layer 154 may be effectively blocked.

Although not shown, a touch sensor layer is formed on the encapsulation layer 156 and a polarizing plate or a color filter layer may be disposed on the touch sensor layer. The touch sensor layer may include capacitance touch sensors that sense a touch input on the basis of a change in capacitance before and after the touch input. The touch sensor layer may include metal interconnection patterns and insulating films that form a capacity of the touch sensors. The insulating films may insulate intersections of the metal interconnection patterns and planarize a surface of the touch sensor layer. The polarizing plate may convert polarization of external light reflected from the metals of the touch sensor layer and the circuit layer to improve visibility and a contrast ratio. The polarizing plate may be embodied as a polarizing plate or circular polarizing plate in which a linear polarizing plate and a phase-delay film are bonded with each other. Cover glass may be adhered on the polarizing plate. The color filter layer may include red, green, and blue color filters. The color filter layer may further include a black matrix pattern. The color filter layer may absorb some light reflected from the circuit layer and the touch sensor layer instead of the polarizing plate and increase the color purity of an image reproduced on the pixel array.

The pixel array includes a plurality of pixel lines L1 to Ln. Each of the pixel lines L1 to Ln includes subpixels in a line that are arranged on the pixel array of the display panel 100 in a direction of lines (X-axis direction). Subpixels arranged in a pixel line share the gate lines 103. Subpixels arranged in a column direction Y along a data-line direction share the same data line 102. 1 horizontal period is a time obtained by dividing one frame period by the total number of the pixel lines L1 to Ln.

The display panel 100 may be embodied as a non-transmissive display panel or a transmissive display panel. The transmissive display panel is applicable to a transparent display device in which an image is displayed on a screen and through which a real background is visible. The display panel 100 may be manufactured as a flexible display panel.

Each pixel 101 may be divided into a red sub-pixel, a green sub-pixel, and a blue sub-pixel to realize colors. Each of the pixels 101 may further include a white sub-pixel. Each of the sub-pixels includes a pixel circuit. Hereinafter, "pixel" may be understood as having the same meaning as "sub-pixel." Each pixel circuit is connected to a data line, gate lines, and power lines.

The pixel circuit includes a light-emitting element EL, a driving element for driving the light-emitting element, and one or more switch elements. The switch elements are turned on or off according to a gate voltage of a gate pulse to connect or disconnect main nodes of the pixel circuit. The switch elements are turned on in response to the gate-on voltage, whereas it is turned off in response to the gate-off voltage. In a case of the n-channel oxide TFT, the gate-on voltage is a high-potential driving voltage VGH of the gate pulse [Gout(N)] outputted from the gate driving circuit 120, and the gate-off voltage is a low-potential reference voltage VGL of the gate pulse [Gout(N)]. The driving element and the switch elements of the pixel circuit may be implemented as n-channel oxide TFTs having a coplanar structure.

Due to process deviation and element characteristics variations caused in the manufacturing process of the display panel, there may be a difference in electrical characteristics of a driving element between pixels, and this difference may be increased as the driving time of the pixels elapses. In order to compensate for variations in the electrical characteristics of the driving element between the pixels, an internal compensation circuit can be embedded in the pixel circuit or an external compensation circuit can be connected to the pixel circuit. The internal compensation circuit can be embedded in the pixel circuit and sense the amount of the threshold voltage change of the driving element, thereby compensating the gate-source voltage of the driving element by the amount of the threshold voltage change. The external compensation circuit may compensate for the change in the electrical characteristics of the driving element by generating a compensation value based on a result of sensing the electrical characteristics of the driving element using the external compensation circuit connected to the pixel circuit. The pixel circuit of the respective sub-pixels may include the internal compensation circuit or may be connected to the external compensation circuit.

The pixels may be arranged as real color pixels and pentile pixels. A pentile pixel may realize a higher resolution than the real color pixel by driving two sub-pixels having different colors as one pixel 101 through the use of a preset pixel rendering algorithm. The pixel rendering algorithm may compensate for insufficient color representation in each pixel with the color of light emitted from an adjacent pixel.

The power supply 140 generates a DC voltage (or constant voltage) necessary for driving the pixel array of the display panel 100 and the display panel driver by using a DC-DC converter. The DC-DC converter may include a charge pump, a regulator, a buck converter, a boost converter, and the like. The power supply 140 may adjust the level of a DC input voltage applied from a host system (not shown) to generate constant voltages such as a gamma reference voltage VGMA, the gate voltages VGH, and VGL, the pixel driving voltage ELVDD, and the low-potential pixel reference voltage ELVSS. The gamma reference voltage VGMA is supplied to the data driver 110. The gate voltages VGH and VGL are supplied to the gate driving circuit 120. The pixel driving voltage ELVDD and the low-potential pixel reference voltage ELVSS are supplied to the pixels 101 through the power lines commonly connected to the pixels 101.

The display panel driver writes pixel data of an input image to the pixels of the display panel 100 under control of a timing controller 130.

The display panel driver includes the data driver 110 and the gate driving circuit 120. The display panel driver may further include the de-multiplexer array 112 between the data driver 110 and the data lines 102.

The de-multiplexer array 112 sequentially applies data voltages output from channels of the data driver 110 to the data lines 102 using a plurality of de-multiplexers (DE-MUXs). The DEMUXs may include a number of switch elements on the display panel 100. When the DEMUXs are disposed between output terminals of the data driver 110 and the data lines 102, the number of channels of the data driver 110 may decrease. The de-multiplexer array 112 may be omitted.

The display panel driver may further include a touch sensor driver to drive the touch sensors. The touch sensor driver is omitted in FIG. 14. The data driver 110 and the touch sensor driver may be integrated into one drive integrated circuit (IC). In a mobile device or wearable device, the timing controller 130, the power supply 140, the data driver 110, etc. may be integrated into one drive IC.

The display panel driver may operate in a low-speed drive mode under control of the timing controller 130. The low-speed driving mode may be set to analyze an input image and reduce power consumption of the display device when a degree of change in the input image is less than a predetermined number of frames. In the low-speed driving mode, when still images are input for a certain time period or more, a refresh rate of pixels may be reduced to reduce power consumption of the display panel driver and the display panel 100. The low-speed driving mode is not limited to a case in which still images are input. For example, the display panel driver may operate in the low-speed driving mode when the display device operates in a standby mode or when a user command or an input image is not input to the display panel driver for a certain time.

The data driver 110 receives pixel data of an input image in the form of a digital signal from the timing controller 130 and outputs a data voltage. The data driver 110 generates a data voltage by converting pixel data of an input image into a gamma compensation voltage in each frame period using a digital-to-analog converter (DAC). The gamma reference voltage VGMA is divided into a gamma compensation voltage for each gradation through a partial pressure circuit. A gamma compensation voltage for each gradation is provided to the DAC of the data driver 110. The data voltage is output through an output buffer in each channel of the data driver 110.

The gate driving circuit 120 may be embodied as a gate-in-panel (GIP) circuit formed on the circuit layer 152 on the display panel 100, together with the TFT array and the interconnections of the pixel array. The gate driving circuit 120 may be disposed on a bezel area BZ that is a non-display area of the display panel 100 or dispersed in the pixel array on which an input image is reproduced.

The gate driving circuit 120 may, as shown in FIG. 14, be disposed in the bezel area BZ on one side of the display panel 100 and may supply a gate pulse [Gout(N)] to the gate lines 103 in a single feeding method. In addition, the gate driving circuit 120 may be disposed in the bezel areas BZ on opposite sides of the display panel 100 with the pixel array interposed therebetween and may supply a gate pulse [Gout(N)] to the gate lines 103 in a double feeding method.

The gate driving circuit 120 sequentially outputs the gate pulse [Gout(N)] to the gate lines 103 under the control of the timing controller 130. The gate driving circuit 120 may shift the gate pulse [Gout(N)] by using a shift register to sequentially supply the gate pulse [Gout(N)] to the gate lines 103. The signal transmitter in the shift register may be implemented as the circuit described above. The gate driving circuit 120 may include two or more shift registers, such as a shift register that generates a scan pulse, a shift register that generates a sensing pulse, a shift register that generates an initialization pulse, and a shift register that generates an emission control pulse (or EM pulse), and each of the shift registers may be implemented as the circuits employed in the above-described embodiments.

The timing controller 130 receives, from the host system, digital video data of an input image and a timing signal synchronized with the digital video data. The timing signal may include a vertical synchronization signal Vsync, a horizontal synchronization signal Hsync, a clock CLK, and a data enable signal DE. Because a vertical period and a horizontal period may be known by counting the data enable signal DE, the vertical synchronization signal Vsync and the horizontal synchronization signal Hsync may be omitted. The data enable signal DE has a cycle of one horizontal period (1H).

The host system may be one of a television (TV) system, a tablet computer, a notebook computer, a navigation system, a personal computer (PC), a home theater system, a mobile device, a wearable device, and a vehicle system. The host system may scale the image signal from the video source to fit the resolution of the display panel 100, and may transmit it to the timing controller 130 together with the timing signal.

The timing controller 130 may multiply the input frame frequency by i (i is a natural number) in a normal driving mode, so that it can control the operation timing of the display panel driver at a frame frequency of the input frame frequency×i Hz. The input frame frequency is 60 Hz in the NTSC (National Television Standards Committee) system and 50 Hz in the PAL (Phase-Alternating Line) system.

In the low-speed driving mode, the timing controller 130 reduces a frequency corresponding to a frame rate at which pixel data is written to pixels, compared to a normal driving mode. For example, a data refresh frame frequency at which pixel data is written to pixels in the normal driving mode may occur at a refresh rate of 60 Hz or higher, e.g., any one of 60 Hz, 120 Hz and 144 Hz, and a data refresh frame DRF in the low-speed driving mode may occur at a refresh rate of corresponding frequency lower than that in the normal driving mode. In order to lower the refresh rate of pixels in the low-speed driving mode, the timing controller 130 may reduce the driving frequency for the display panel driver by reducing the frame frequency to a frequency between 1 Hz and 30 Hz.

The timing controller 130 generates a data timing control signal for controlling the operation timing of the data driver 110 based on the timing signals Vsync, Hsync, and DE received from the host system, a control signal for controlling the operation timing of the de-multiplexer array 112, and a gate timing control signal for controlling the operation timing of the gate driving circuit 120. The timing controller 130 synchronizes the data driver 110, the de-multiplexer array 112, the touch sensor driver, and the gate driving circuit 120 by controlling the operation timing of the display panel driver.

The gate timing control signal generated from the timing controller 130 may be inputted to the shift registers of the gate driving circuit 120 through a level shifter (not shown). The level shifter may receive the gate timing control signal and generate a start pulse and a shift clock to provide them to the shift registers of the gate driving circuit 120.

The objects to be achieved by the present disclosure, the means for achieving the objects, and effects of the present disclosure described above do not specify essential features of the claims, and thus, the scope of the claims is not limited to the specific description of the present disclosure.

It will be apparent to those skilled in the art that various modifications and variations can be made in the gate driving circuit and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driving circuit, comprising: signal transmitters receiving a start pulse, a shift clock, a charge/discharge clock, a back-bias clock, a high-potential driving voltage, and a low-potential reference voltage, and connected in a cascade structure, an Nth (N is a positive integer) signal transmitter of the signal transmitters including: a first control node; a second control node; a first controller controlling charging and discharging of the first control node by using at least one transistor to which the back-bias clock is inputted; a second controller controlling charging and discharging of the second control node; a first output buffer outputting a carry pulse in response to voltages of the first and second control nodes; and a second output buffer outputting a gate pulse; wherein a high voltage of the charge/discharge clock is different from a high voltage of the back-bias clock, and a low voltage of the charge/discharge clock is different from a low voltage of the back-bias clock.

2. The gate driving circuit of claim 1, wherein the charge/discharge clock includes:
 a first charge/discharge clock inputted to a first-first CLK node; and
 a second charge/discharge clock generated in antiphase of the first charge/discharge clock and inputted to a second-first CLK node,
 the back-bias clock includes:
 a first back-bias clock inputted to a first-second CLK node; and
 a second back-bias clock generated in antiphase of the first back-bias clock and inputted to a second-second CLK node,
 the shift clock is inputted to a third CLK node,
 the first charge/discharge clock and the first back-bias clock are in-phase clocks, and
 the second charge/discharge clock and the second back-bias clock are in-phase clocks.

3. The gate driving circuit of claim 2, wherein a high voltage of each of the first and second charge/discharge clocks is higher than a high voltage of each of the first and second back-bias clocks,
 a low voltage of each of the first and second charge/discharge clocks is higher than a low voltage of each of the first and second back-bias clocks,
 the high voltage of each of the first and second charge/discharge clocks is equal to or higher than a high voltage of the shift clock, and
 the low voltage of each of the first and second charge/discharge clocks is lower than a low voltage of the shift clock.

4. The gate driving circuit of claim 3, wherein the low voltage of the shift clock is a first low-potential reference voltage, the high voltage of the shift clock is a second high-potential driving voltage,
 the low voltage of each of the first and second charge/discharge clocks is a second low-potential reference voltage lower than the first low-potential reference voltage, and the high voltage of each of the first and second charge/discharge clocks is the second high-potential driving voltage, and
 the low voltage of each of the first and second back-bias clocks is a third low-potential reference voltage lower than the second low-potential reference voltage, and the high voltage of each of the first and second back-bias clocks is a first high-potential driving voltage lower than the second high-potential driving voltage.

5. The gate driving circuit of claim 2, wherein the first controller includes at least first, second, and third transistors,
 the first transistor includes a first gate electrode connected to the second-first CLK node, a second gate electrode connected to the second-second CLK node, a first electrode connected to a VST node to which the start pulse or an N−1th carry pulse of a preceding signal transmitter is inputted, and a second electrode connected to the first control node,
 the second transistor includes a first gate electrode connected to the first-first CLK node, a second gate electrode connected to the first-second CLK node, a first electrode connected to the first control node, and a second electrode connected to a third node,
 the third transistor includes a first gate electrode connected to the second control node, a second gate electrode connected to a third VSS node to which a third low-potential reference voltage is applied, a first electrode connected to the third node, and a second electrode connected to a second VSS node to which a second low-potential reference voltage is applied, and
 the third low-potential reference voltage is lower than the second low-potential reference voltage.

6. The gate driving circuit of claim 5, wherein the second controller includes at least fourth and fifth transistors to which the second back-bias clock is inputted.

7. The gate driving circuit of claim 6, wherein the fourth transistor includes a first gate electrode connected to the second-first CLK node, a second gate electrode connected to the second-second CLK node, a first electrode connected to a VDD node to which the high-potential driving voltage is applied, and a second electrode connected to the second control node, and
 the fifth transistor includes a first gate electrode connected to the first control node, a second gate electrode connected to the second-second CLK node, a first electrode connected to the second-first CLK node, and a second electrode connected to the second control node.

8. The gate driving circuit of claim 7, wherein the first output buffer includes at least sixth, seventh, and eighth transistors, and second and third capacitors,
 the sixth transistor includes a first gate electrode connected to the first control node, a second gate electrode connected to a fourth node, a first electrode connected to the first-first CLK node, and a second electrode connected to a first output node through which the carry pulse is outputted,
 the second capacitor is connected between the fourth node and the first output node,
 the seventh transistor includes a first gate electrode connected to the second control node, a second gate electrode connected to the third VSS node, a first electrode connected to the first output node, and a second electrode connected to the second VSS node,
 the third capacitor is connected between the second control node and the second VSS node, and
 the eighth transistor includes a gate electrode connected to the second-second CLK node, a first electrode connected to the third VSS node, and a second electrode connected to the fourth node.

9. The gate driving circuit of claim 8, wherein the second output buffer includes at least ninth and tenth transistors and a first capacitor,
 the ninth transistor includes a gate electrode connected to the first control node, a first electrode connected to the third CLK node, and a second electrode connected to a second output node through which the gate pulse is outputted, the first capacitor is connected between the first control node and the second output node, the tenth transistor includes a gate electrode connected to the second control node, a first electrode connected to the second output node, and a second electrode connected to a first VSS node to which a first low-potential reference voltage is applied, and the first low-potential reference voltage is higher than the second low-potential reference voltage.

10. A gate driving circuit, comprising: signal transmitters receiving a start pulse, a shift clock, a charge/discharge clock, a back-bias clock, a high-potential driving voltage, and a low-potential reference voltage, and connected in a cascade structure, an Nth (N is a positive integer) signal transmitter of the signal transmitters including: a first control node; a second control node; a first controller controlling charging and discharging of the first control node by using at least one 4-terminal transistor to which the back-bias clock is inputted; a second controller controlling charging and discharging of the second control node by using at least one 4-terminal transistor to which the back-bias clock is inputted; a first output buffer outputting a carry pulse in response to voltages of the first and second control nodes; and a second output buffer outputting a gate pulse; wherein a high voltage of the charge/discharge clock is different from a high voltage of the back-bias clock, and a low voltage of the charge/discharge clock is different from a low voltage of the back-bias clock.

11. The gate driving circuit of claim 10, wherein the first output buffer includes at least one 4-terminal transistor including a second gate electrode to which a constant voltage is applied.

12. A display device, comprising: a display panel including a plurality of data lines to which a data voltage is applied, a plurality of gate lines to which a gate pulse is applied, a plurality of clock lines, a plurality of power lines, a plurality of pixels, and a gate driving circuit generating the gate pulse, the gate driving circuit comprising: signal transmitters receiving a start pulse, a shift clock, a charge/discharge clock, a back-bias clock, a high-potential driving voltage, and a low-potential reference voltage, and connected in a cascade structure, an Nth (N is a positive integer) signal transmitter of the signal transmitters including: a first control node; a second control node; a first controller controlling charging and discharging of the first control node by using at least one transistor to which the back-bias clock is inputted; a second controller controlling charging and discharging of the second control node; a first output buffer outputting a carry pulse in response to voltages of the first and second control nodes; and a second output buffer outputting the gate pulse; wherein a high voltage of the charge/discharge clock is different from a high voltage of the back-bias clock, and a low voltage of the charge/discharge clock is different from a low voltage of the back-bias clock.

13. The display device of claim 12, wherein the charge/discharge clock includes:

a first charge/discharge clock inputted to a first-first CLK node; and a second charge/discharge clock generated in antiphase of the first charge/discharge clock and inputted to a second-first CLK node, the back-bias clock includes:

a first back-bias clock inputted to a first-second CLK node; and a second back-bias clock generated in antiphase of the first back-bias clock and inputted to a second-second CLK node, the shift clock is inputted to a third CLK node, the first charge/discharge clock and the first back-bias clock are in-phase clocks, and the second charge/discharge clock and the second back-bias clock are in-phase clocks.

14. The display device of claim 13, wherein a high voltage of each of the first and second charge/discharge clocks is higher than a high voltage of each of the first and second back-bias clocks, a low voltage of each of the first and second charge/discharge clocks is higher than a low voltage of each of the first and second back-bias clocks, the high voltage of each of the first and second charge/discharge clocks is equal to or higher than a high voltage of the shift clock, and the low voltage of each of the first and second charge/discharge clocks is lower than a low voltage of the shift clock.

15. The display device of claim 13, wherein the low voltage of the shift clock is a first low-potential reference voltage, the high voltage of the shift clock is a second high-potential driving voltage, the low voltage of each of the first and second charge/discharge clocks is a second low-potential reference voltage lower than the first low-potential reference voltage, and the high voltage of each of the first and second charge/discharge clocks is the second high-potential driving voltage, and the low voltage of each of the first and second back-bias clocks is a third low-potential reference voltage lower than the second low-potential reference voltage, and the high voltage of each of the first and second back-bias clocks is a first high-potential driving voltage lower than the second high-potential driving voltage.

16. The display device of claim 12, wherein the second controller includes at least one 4-terminal transistor to which the back-bias clock is inputted.

17. The display device of claim 16, wherein the first output buffer includes at least one 4-terminal transistor including a second gate electrode to which a constant voltage is applied.

18. The display device of claim 12, wherein a circuit layer of the display panel includes the gate driving circuit, and all transistors disposed in the circuit layer of the display panel are n-channel oxide thin film transistors (TFTs).

* * * * *